US 8,415,010 B2

(12) United States Patent
Liu et al.

(10) Patent No.: US 8,415,010 B2
(45) Date of Patent: Apr. 9, 2013

(54) NANO-IMPRINT LITHOGRAPHY STACK WITH ENHANCED ADHESION BETWEEN SILICON-CONTAINING AND NON-SILICON CONTAINING LAYERS

(75) Inventors: Weijun Liu, Cedar Park, TX (US); Frank Y. Xu, Round Rock, TX (US)

(73) Assignee: Molecular Imprints, Inc., Austin, TX (US)

( * ) Notice: Subject to any disclaimer, the term of this patent is extended or adjusted under 35 U.S.C. 154(b) by 641 days.

(21) Appl. No.: 12/581,634

(22) Filed: Oct. 19, 2009

(65) Prior Publication Data

US 2010/0098940 A1 Apr. 22, 2010

Related U.S. Application Data

(60) Provisional application No. 61/106,642, filed on Oct. 20, 2008.

(51) Int. Cl.
*B32B 27/08* (2006.01)
(52) U.S. Cl. .......... 428/336; 428/446; 428/448; 428/451
(58) Field of Classification Search .................. 428/336, 428/446, 448, 451
See application file for complete search history.

(56) References Cited

U.S. PATENT DOCUMENTS

| 3,912,670 A | 10/1975 | Huemmer et al. |
| 4,308,317 A * | 12/1981 | Olson et al. .................. 428/412 |
| 4,517,337 A | 5/1985 | Lockhart et al. |
| 5,102,977 A | 4/1992 | McLafferty et al. |
| 5,182,174 A | 1/1993 | Stephenson |
| 5,366,768 A | 11/1994 | Kasari et al. |
| 5,737,064 A | 4/1998 | Inoue et al. |
| 5,905,104 A | 5/1999 | Eklund et al. |
| 6,334,960 B1 | 1/2002 | Willson et al. |
| 6,342,097 B1 | 1/2002 | Terry et al. |

(Continued)

FOREIGN PATENT DOCUMENTS

| EP | 0803555 B1 | 7/2002 |
| JP | 2-219881 | 9/1990 |

(Continued)

OTHER PUBLICATIONS

European, Written Opinion of the International Searching Authority, PCT/US2009/005693 mailed Feb. 11, 2010, 7 pages.

(Continued)

*Primary Examiner* — D. S. Nakarani
(74) *Attorney, Agent, or Firm* — Heather L. Flanagan; Fish & Richardson P.C.

(57) ABSTRACT

A nano-imprint lithography stack includes a nano-imprint lithography substrate, a non-silicon-containing layer solidified from a first polymerizable, non-silicon-containing composition, and a silicon-containing layer solidified from a polymerizable silicon-containing composition adhered to a surface of the non-silicon-containing layer. The non-silicon-containing layer is adhered directly or through one or more intervening layers to the nano-imprint lithography substrate. The silicon-containing layer includes a silsesquioxane with a general formula $(R'_{(4-2z)}SiO_z)_x(HOSiO_{1.5})_y$, wherein R' is a hydrocarbon group or two or more different hydrocarbon groups other than methyl, $1<z<2$, and x and y are integers. The imprint lithography stack may further include a second non-silicon-containing layer solidified from a second polymerizable, non-silicon-containing composition adhered to a surface of the silicon-containing layer such that the silicon-containing layer is sandwiched between the non-silicon-containing layers.

14 Claims, 3 Drawing Sheets

U.S. PATENT DOCUMENTS

| | | | |
|---|---|---|---|
| 6,410,209 | B1 | 6/2002 | Adams et al. |
| 6,468,896 | B2 | 10/2002 | Röhr et al. |
| 6,731,857 | B2 | 5/2004 | Shelnut et al. |
| 6,814,879 | B2 | 11/2004 | Shibata |
| 6,873,087 | B1 | 3/2005 | Choi et al. |
| 6,897,259 | B1 | 5/2005 | Cramer |
| 6,900,881 | B2 | 5/2005 | Sreenivasan et al. |
| 6,932,934 | B2 | 8/2005 | Choi et al. |
| 6,936,194 | B2 | 8/2005 | Watts |
| 7,122,079 | B2 | 10/2006 | Xu et al. |
| 7,122,482 | B2 | 10/2006 | Xu et al. |
| 7,157,036 | B2 | 1/2007 | Choi et al. |
| 7,179,396 | B2 | 2/2007 | Sreenivasan |
| 7,186,656 | B2 | 3/2007 | Sreenivasan |
| 7,259,102 | B2 | 8/2007 | Wang et al. |
| 7,261,831 | B2 | 8/2007 | Sreenivasan |
| 7,307,118 | B2 | 12/2007 | Xu et al. |
| 7,323,417 | B2 | 1/2008 | Sreenivasan |
| 7,662,527 | B2 | 2/2010 | Wu et al. |
| 7,670,953 | B2 | 3/2010 | Sreenivasan |
| 2002/0127499 | A1 | 9/2002 | Endo et al. |
| 2003/0235787 | A1 | 12/2003 | Watts et al. |
| 2004/0065252 | A1 | 4/2004 | Sreenivasan et al. |
| 2004/0065976 | A1 | 4/2004 | Sreenivasan et al. |
| 2004/0110856 | A1 | 6/2004 | Young |
| 2004/0124566 | A1 | 7/2004 | Sreenivasan et al. |
| 2004/0188381 | A1 | 9/2004 | Sreenivasan |
| 2004/0202872 | A1 | 10/2004 | Fang et al. |
| 2004/0211754 | A1 | 10/2004 | Sreenivasan |
| 2004/0229158 | A1 | 11/2004 | Meador et al. |
| 2004/0241338 | A1 | 12/2004 | Foster et al. |
| 2005/0040532 | A1 | 2/2005 | Kumar et al. |
| 2005/0187339 | A1 | 8/2005 | Xu et al. |
| 2006/0224009 | A1 | 10/2006 | Hamada et al. |
| 2007/0017637 | A1 | 1/2007 | Lee et al. |
| 2007/0021520 | A1 | 1/2007 | Xu |
| 2007/0212494 | A1 | 9/2007 | Xu et al. |
| 2008/0097065 | A1 | 4/2008 | Xu et al. |
| 2010/0140218 | A1 | 6/2010 | Sreenivasan |
| 2011/0140306 | A1 | 6/2011 | Xu et al. |

FOREIGN PATENT DOCUMENTS

| | | |
|---|---|---|
| JP | 4-366958 | 12/1992 |
| JP | 2001343757 | 12/2001 |
| JP | 2002251802 | 9/2002 |
| JP | 2002270541 | 9/2002 |
| JP | 2001131492 | 5/2005 |
| WO | WO 2004/088414 | 10/2004 |
| WO | WO2005007764 | 1/2005 |
| WO | WO 2005/114719 | 12/2005 |
| WO | WO 2010/047770 | 4/2010 |

OTHER PUBLICATIONS

International Search Report and Written Opinion for PCT/US2004/08920 mailed Jan. 6, 2006, 8 pages.

Taniguchi et al., "Measurement of Adhesive Force Between Mold and Photocurable Resin in Imprint Technology," Japanese Journal of Applied Physics, vol. 41 (2002) pp. 4194-4197.

MSDS for Dow Corning Z-6018 Intermediate, 2005, 8 pages.

Data Sheet for Silsesquioxanes, Aldrich Website—printed Sep. 20, 2005, 4 pages.

Dent et al., Microelectronic Grade Silicon Materials for CSP, Dow Corning Coporation, Jan. 1, 1999, 21 pages.

Barclay et al., "Bilayer Resist Solutions for Sub 100 nm Device Production," Publication date that is known to Applicant is before the filing date of the instant application.

Zhang et al., "Hydrosilylation of Allyl Alcohol with [HSiMeOSiO]: Octa(3-hydroxypropyldimethylsiloxy)octasilsesquioxane and its Octamethacrylate Derivative as Potential Precursors to Hybrid Nanocomposites," JACS 2000, 122(29), 6979-6988.

Bender et al., Multiple Imprinting in UV-based Nanoimprint Lithography: Related Material Issues, Microelectronic Engineering 61-62 (2002) pp. 407-413.

Data sheet for Methyl n-Amyl Ketone, www.arb.ca.gov/db/solvents/solvent_pages/Ketones-HTML/methyl_amyl.htm Mar. 31, 2005, 1 page.

Data sheet for gamma-glycidoxypropyltrimethoxysilane, www.powerchemical.net/3100.htm Dec. 5, 2003, 2 pages.

Silicon or Silica, Mineral Information Institute, www.mii.org/Minerals/photosil Mar. 31, 2005, 4 pages.

Electronic Devices and Circuits, people.deas.harvard.edu/~jones/es154/lectures/lecture_2/materials.html Mar. 31, 2005, 6 pages.

Data sheet for Cymel 303ULF, www.cytec.com Jan. 1, 2000, 2 pages.

Data sheet for Cycat, 4040 www.cytec.com Jan. 1, 1990, 2 pages.

International Chemical Safety Card for p-Toluenesulfonic Acid, www.itcilo.it/english/actrav/telearn/osh/ic/104154.htm Dec. 5, 2003, 3 pages.

Data sheet for p-Toluensulfonic acid, NIOSH Manual of Analytical Methods (NMAM), Fourth Edition Dec. 5, 2003, 4 pages.

Data Sheet for Dow Corning Z-6018, Jan. 1, 2001, 4 pages.

Data sheet for MAK (Methyl n-Amyl Ketone), www.sp-chem.com/fine_e Jan. 1, 2003, 2 pages.

Bender et al., "Optical and Sub-Optical Imaging Technique Using Optical imaging" IBM Technical Disclosure Bulletin, vol. 32, No. 5B, Oct. 1989, pp. 435-436.

PCT/US2009/005693 International Search Report, Feb. 11, 2010.

* cited by examiner

NANO-IMPRINT LITHOGRAPHY STACK WITH ENHANCED ADHESION BETWEEN SILICON-CONTAINING AND NON-SILICON CONTAINING LAYERS

CROSS-REFERENCE TO RELATED APPLICATIONS

This application claims the benefit under 35 U.S.C. §119 (e)(1) of U.S. Provisional Patent Application Ser. No. 61/106,642, filed Oct. 20, 2008, which is hereby incorporated by reference in its entirety.

STATEMENT OF GOVERNMENT INTEREST

This invention was made with government support under NIST ATP Award No. 70NANB4H3012. The U.S. government has certain rights in the invention.

BACKGROUND

Nano-fabrication includes the fabrication of very small structures that have features on the order of 100 nanometers or smaller. One application in which nano-fabrication has had a sizeable impact is in the processing of integrated circuits. The semiconductor processing industry continues to strive for larger production yields while increasing the circuits per unit area formed on a substrate, therefore nano-fabrication becomes increasingly important. Nano-fabrication provides greater process control while allowing continued reduction of the minimum feature dimensions of the structures formed. Other areas of development in which nano-fabrication has been employed include biotechnology, optical technology, mechanical systems, and the like.

An exemplary nano-fabrication technique in use today is commonly referred to as imprint lithography. Exemplary imprint lithography processes are described in detail in numerous publications, such as U.S. Patent Publication No. 2004/0065976, U.S. Patent Publication No. 2004/0065252, and U.S. Pat. No. 6,936,194, all of which are herein incorporated by reference.

An imprint lithography technique disclosed in each of the aforementioned U.S. patent publications and patent, includes formation of a relief pattern in a polymerizable layer and transferring a pattern corresponding to the relief pattern into an underlying substrate. The substrate may be coupled to a motion stage to obtain a desired positioning to facilitate the patterning process. The patterning process uses a template spaced apart from the substrate and a formable liquid applied between the template and the substrate. The formable liquid is solidified to form a rigid layer that has a pattern conforming to a shape of the surface of the template that contacts the formable liquid. After solidification, the template is separated from the rigid layer such that the template and the substrate are spaced apart. The substrate and the solidified layer are then subjected to additional processes to transfer a relief image into the substrate that corresponds to the pattern in the solidified layer.

In some cases, a stack including multiple layers is formed in imprint lithography. These layers may be organic (e.g., carbon-containing and substantially free of metals, including semi-conductors) or inorganic (e.g., non-carbon-containing). Some carbon-containing layers with a high silicon content (e.g., spin-on-glasses including methyl silsesquioxane) may behave like inorganic layers (e.g., spin-on-glasses including hydrogen silsesquioxane) in terms of bonding and adhesion. If adhesion between layers in an imprint lithography stack is low, delamination of one or more of the layers may occur when the template is separated from a rigid layer (e.g., a hard mask layer).

SUMMARY

In one aspect, a polymerizable nano-imprint lithography composition for use as a hard mask layer in an imprint lithography stack includes a cross-linking agent, an initiator, a solvent, and a silsesquioxane with a general formula $(R'_{(4-2z)}SiO_z)_x(HOSiO_{1.5})_y$, wherein $R'$ is a hydrocarbon group or two or more different hydrocarbon groups other than methyl), $1<z<2$, and $x$ and $y$ are integers. The composition is capable of forming covalent bonds with a non-silicon-containing layer in an imprint lithography stack during polymerization of the composition. Adhesion between the silicon-containing layer and the non-silicon-containing layer is improved when both compositions include compounds with the same functionality.

In one aspect, a nano-imprint lithography stack includes a nano-imprint lithography substrate, a non-silicon-containing layer solidified from a first polymerizable, non-silicon-containing composition, and a silicon-containing layer solidified from a polymerizable silicon-containing composition adhered to a surface of the non-silicon-containing layer. The non-silicon-containing layer is adhered directly or through one or more intervening layers to the nano-imprint lithography substrate. The silicon-containing layer includes a silsesquioxane with a general formula $(R'_{(4-2z)}SiO_z)_x(HOSiO_{1.5})_y$, wherein $R'$ is a hydrocarbon group or two or more different hydrocarbon groups other than methyl, $1<z<2$, and $x$ and $y$ are integers.

In another aspect, forming an imprint lithography stack includes depositing a non-silicon-containing polymerizable composition directly or indirectly on a nano-imprint lithography substrate, polymerizing the non-silicon-containing polymerizable composition to form a solidified non-silicon-containing layer, depositing a silicon-containing polymerizable composition on the solidified non-silicon-containing layer, and polymerizing the silicon-containing polymerizable composition to form a solidified silicon-containing layer adhered to the non-silicon-containing layer. The silicon-containing polymerizable composition includes a silsesquioxane with a general formula $(R'_{(4-2z)}SiO_z)_x(HOSiO_{1.5})_y$, wherein $R'$ is a hydrocarbon group or two or more different hydrocarbon groups other than methyl, $1<z<2$, and $x$ and $y$ are integers.

In some implementations, the imprint lithography stack further includes a second non-silicon-containing layer solidified from a second polymerizable, non-silicon-containing composition adhered to a surface of the silicon-containing layer such that the silicon-containing layer is sandwiched between the non-silicon-containing layers.

In some implementations, a second non-silicon-containing polymerizable composition is deposited on the solidified silicon-containing layer and the non-silicon-containing polymerizable composition is polymerized to form a solidified non-silicon-containing layer adhered to the silicon-containing layer.

In some implementations, polymerizing the second non-silicon-containing composition may include irradiating the second non-silicon-containing composition with ultraviolet radiation. Polymerizing the non-silicon-containing composition may include heating the non-silicon-containing composition. Polymerizing the silicon-containing composition may include irradiating the silicon-containing composition with ultraviolet radiation. Polymerizing the silicon-containing composition may include forming covalent bonds between unreacted functional groups on the surface of the non-silicon-containing layer and a carbon-containing compound in the silicon-containing composition.

In some implementations, a silicon content of the silicon-containing layer is at least about 10 wt % or at least about 15 wt %. The silicon-containing layer may be adhered to the non-silicon-containing layer through covalent bonds between carbon-containing components in the non-silicon-containing layer and carbon-containing components in the silicon-containing composition. The silicon-containing layer may be adhered to the non-silicon-containing layer through polar interactions between carbon-containing components in the non-silicon-containing layer and carbon-containing components in the silicon-containing composition. The polar interactions may include hydrogen-bonding interactions, van der Waals interactions, or a combination thereof. The silicon-containing layer may be less than about 100 nm thick. In some cases, R' may include a phenyl group or a substituted phenyl group. The carbon-containing compound in the silicon-containing composition may be a crosslinking agent. The silicon-containing layer may include a carbon-containing compound with a polar functional group. The silicon-containing composition includes a component with the same functionality as a component in the non-silicon-containing composition.

One or more of these features may be combined as desired to form an imprint lithography stack with improved interfacial adhesion. Hard mask layers with improved adhesion described herein include a silicon content of at least about 10 wt %, at least about 15 wt %, or at least about 20 wt %. The hard mask layers have favorable etch characteristics due to the inorganic nature of the composition. The hard mask layers also demonstrate improved adhesion to organic layers, attributed at least in part to organic functional groups in the hard mask layer composition. Stacks formed with these hard mask layers demonstrate improved adhesion and thus more resistance to the tensile pull force during the template separation step of nano-imprinting lithography. The improved adhesion may be achieved by combining a silicon-containing compound with some organic nature with polar organic compounds, such as polar organic compounds and cross-linking agents, to make the hard mask layer more compatible with the organic layers (i.e., to promote formation of polar interactions and/or covalent bonds at each interface between the hard mask layer and an organic layer (e.g., an organic underlayer, and organic imprint resist layer, an adhesion layer, and the like). The imprint lithography stack described herein also reduces or removes the need to pre-treat the surface of the hard mask layer to improve adhesion of organic layers to the hard mask layer, thereby reducing processing costs and simplifying process flow.

DETAILED DESCRIPTION

Figure 1:
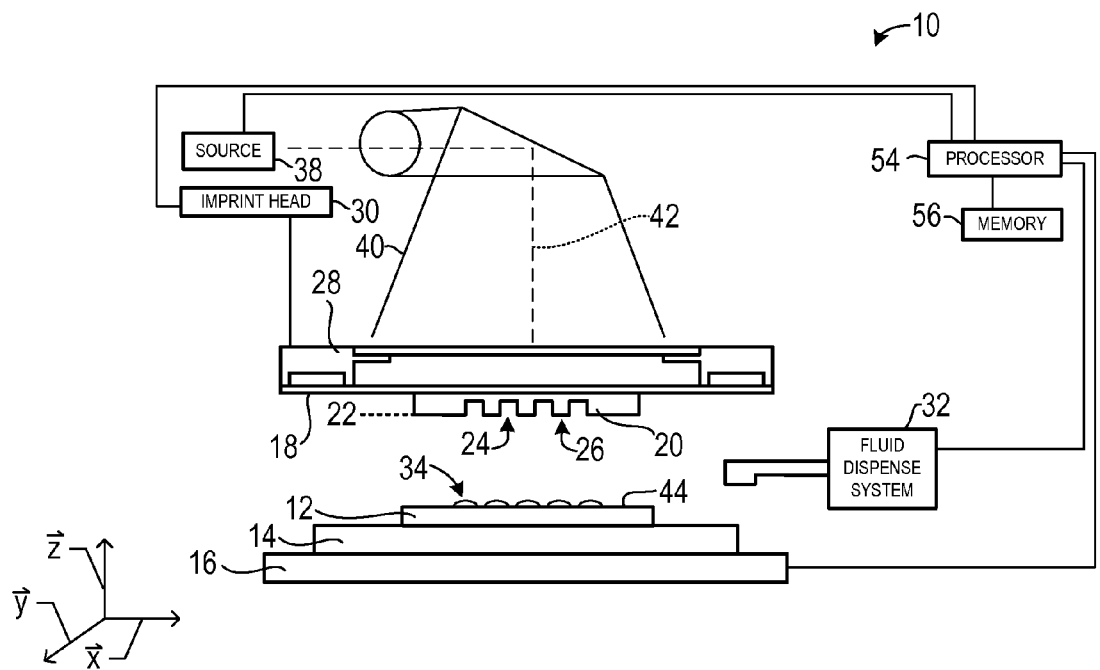
FIG. 1 illustrates a simplified side view of one embodiment of a lithographic system.

Referring to FIG. 1, illustrated therein is a lithographic system 10 used to form a relief pattern on substrate 12. Substrate 12 may be coupled to substrate chuck 14. As illustrated, substrate chuck 14 is a vacuum chuck. Substrate chuck 14, however, may be any chuck including, but not limited to, vacuum, pin-type, groove-type, electromagnetic, and/or the like. Exemplary chucks are described in U.S. Pat. No. 6,873,087, which is herein incorporated by reference.

Substrate 12 and substrate chuck 14 may be further supported by stage 16. Stage 16 may provide motion about the x-, y-, and z-axes. Stage 16, substrate 12, and substrate chuck 14 may also be positioned on a base (not shown).

Spaced-apart from substrate 12 is a template 18. Template 18 generally includes a mesa 20 extending therefrom towards substrate 12, mesa 20 having a patterning surface 22 thereon. Further, mesa 20 may be referred to as mold 20. Template 18 and/or mold 20 may be formed from such materials including, but not limited to, fused-silica, quartz, silicon, organic polymers, siloxane polymers, borosilicate glass, fluorocarbon polymers, metal, hardened sapphire, and/or the like. As illustrated, patterning surface 22 comprises features defined by a plurality of spaced-apart recesses 24 and/or protrusions 26, though embodiments of the present invention are not limited to such configurations. Patterning surface 22 may define any original pattern that forms the basis of a pattern to be formed on substrate 12.

Template 18 may be coupled to chuck 28. Chuck 28 may be configured as, but not limited to, vacuum, pin-type, groove-type, electromagnetic, and/or other similar chuck types. Exemplary chucks are further described in U.S. Pat. No. 6,873,087, which is herein incorporated by reference. Further, chuck 28 may be coupled to imprint head 30 such that chuck 28 and/or imprint head 30 may be configured to facilitate movement of template 18.

System 10 may further comprise a fluid dispense system 32. Fluid dispense system 32 may be used to deposit polymerizable composition 34 on substrate 12. Polymerizable composition 34 may be positioned upon substrate 12 using techniques such as drop dispense, spin-coating, dip coating, chemical vapor deposition (CVD), physical vapor deposition (PVD), thin film deposition, thick film deposition, and/or the like. Polymerizable composition 34 may be disposed upon substrate 12 before and/or after a desired volume is defined between mold 22 and substrate 12 depending on design considerations. Polymerizable composition 34 may comprise a monomer as described in U.S. Pat. No. 7,157,036 and U.S. Patent Publication No. 2005/0187339, all of which are herein incorporated by reference.

Figure 2:
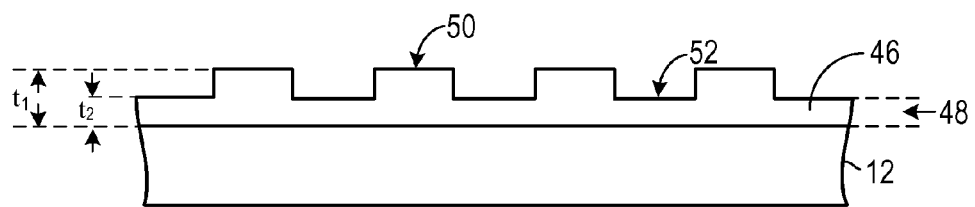
FIG. 2 illustrates a simplified side view of the substrate shown in FIG. 1 having a patterned layer positioned thereon.

Referring to FIGS. 1 and 2, system 10 may further comprise an energy source 38 coupled to direct energy 40 along path 42. Imprint head 30 and stage 16 may be configured to position template 18 and substrate 12 in superimposition with path 42. System 10 may be regulated by a processor 54 in communication with stage 16, imprint head 30, fluid dispense system 32, and/or source 38, and may operate on a computer readable program stored in memory 56.

Either imprint head 30, stage 16, or both vary a distance between mold 20 and substrate 12 to define a desired volume therebetween that is filled by polymerizable composition 34. For example, imprint head 30 may apply a force to template 18 such that mold 20 contacts polymerizable composition 34. After the desired volume is filled with polymerizable composition 34, source 38 produces energy 40, e.g., broadband ultraviolet radiation, causing polymerizable composition 34 to solidify and/or cross-link conforming to shape of a surface 44 of substrate 12 and patterning surface 22, defining a patterned layer 46 on substrate 12. Patterned layer 46 may include a residual layer 48 and a plurality of features shown as protrusions 50 and recessions 52, with protrusions 50 having thickness t1 and residual layer having a thickness t2.

The above-mentioned system and process may be further employed in imprint lithography processes and systems referred to in U.S. Pat. No. 6,932,934, U.S. Patent Publication No. 2004/0124566, U.S. Patent Publication No. 2004/0188381, and U.S. Patent Publication No. 2004/0211754, each of which is herein incorporated by reference.

Figure 3A:
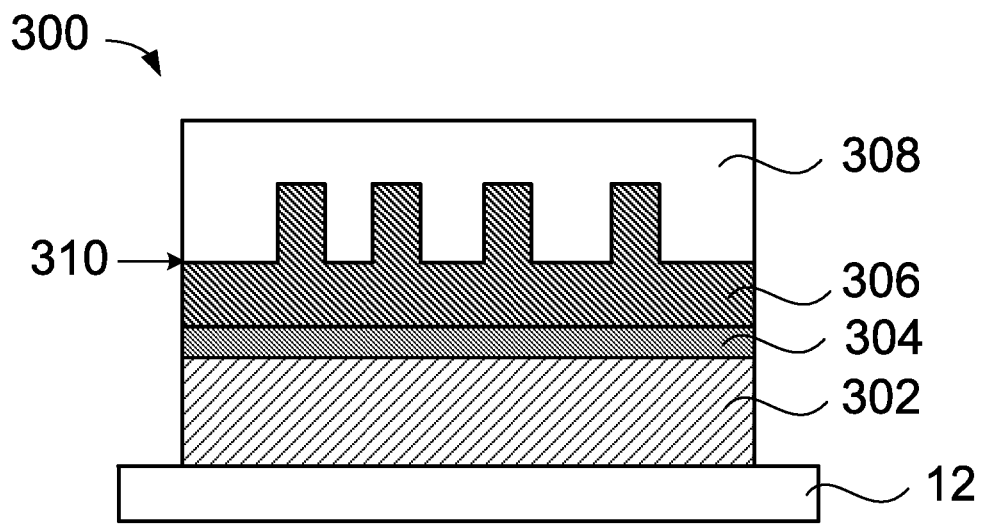
FIGS. 3A and 3B illustrate imprint lithography stacks.

FIG. 3A illustrates imprint lithography stack 300 formed by an imprint lithography process. Imprint lithography stack 300 includes substrate 12, organic underlayer 302, adhesion layer 304, organic imprint resist 306, and hard mask layer 308. Organic imprint resist 306 and hard mask layer 308 form interface 310. As described herein, organic underlayer 302, adhesion layer 304, and organic imprint resist 306 are substantially non-silicon-containing.

Figure 3B:
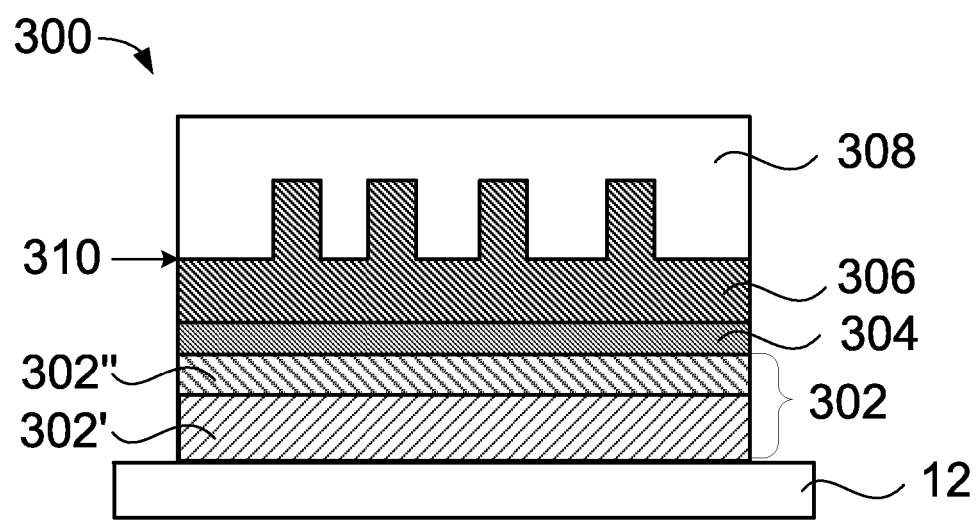

In some cases, as shown in FIG. 3B, organic underlayer 302 includes two or more sub-layers 302' and 302''. Sub-layer 302' may be a conventional photoresist or a lift-off material. An example of a conventional photoresist is a novolak resin for an i-line resist. An example of a lift-off material is polymethylglutarimide (PMGI), as described in U.S. Pat. No. 7,122,482, which is incorporated herein by reference. The photoresist or lift-off materials may be thermally hard baked to inhibit intermixing during the coating of sub-layer 302''. Sub-layer 302'' may be spun onto sub-layer 302'. In some cases, sub-layer 302' is thicker than sub-layer 302''.

Figure 4:
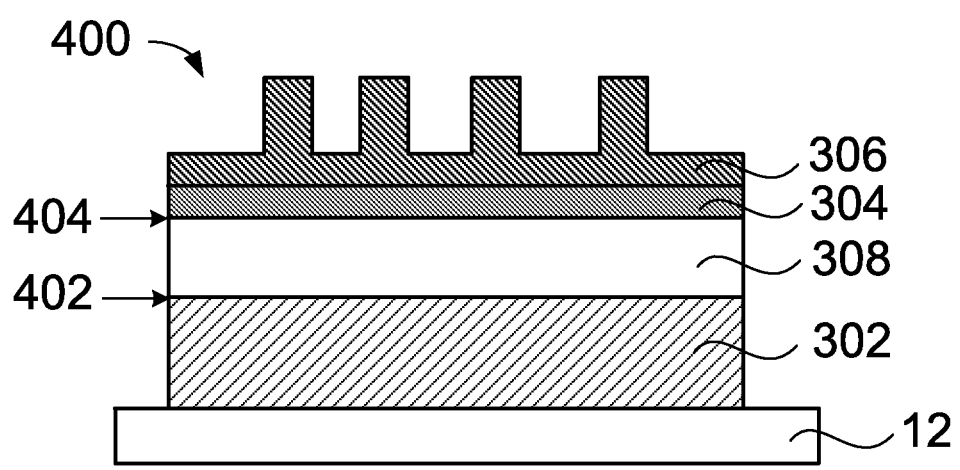
FIG. 4 illustrates an imprint lithography stack.

Some imprint lithography stacks include three or more layers between the organic imprint resist 306 and the substrate 12. FIG. 4 illustrates imprint lithography stack 400 with organic underlayer 302, hard mask layer 308 adhered to the organic underlayer, and adhesion layer 304 coated over the hard mask layer. Organic underlayer 302 and hard mask layer 308 form interface 402, and hard mask layer 308 and adhesion layer 304 form interface 404.

For imprint lithography stacks illustrate in FIGS. 3A, 3B, and 4, hard mask layer 308 may be spun on or imprinted on the stack (e.g., on organic imprint resist 306, as shown in FIGS. 3A and 3B, or on organic underlayer 302, as shown in FIG. 4). When the hard mask layer 308 is spun on or imprinted over the stack, the hard mask layer adheres to the layer underneath. This adhesion may be attributed at least in part to similar crosslinking chemistry of the hard mask layer 308 and the organic underlayer 302 or organic imprint resist layer 306, which allows bonding to occur between the hard mask layer and the layer on which it is formed. In some cases, the composition used to form the hard mask may penetrate into the organic underlayer 302 or the organic imprint resist 306 while the composition spreads during the imprinting process, providing enhanced interfacial adhesion after the two layers are crosslinked together.

For imprint lithography stacks including those illustrated in FIGS. 3A, 3B, and 4, the organic underlayer 302 may be several hundred nanometers thick, or thick enough to cover the topography of the substrate 12 to be etched. The hard mask layer 308 may be less than about 100 nm thick. The adhesion layer 304 may be less than about 100 nm thick, or less than about 10 nm thick. In some cases, the adhesion layer 304 is about 1 nm thick.

A polymerizable composition used to form organic underlayer 302 or adhesion layer 304 may include a crosslinking agent, a catalyst, a solvent, and a multi-functional reactive compound with two, three, or more functional groups. One or more of the functional groups may be the same. In some cases, all of the functional groups are different. The multi-functional reactive compound is non-silicon-containing. In some cases, the multi-functional reactive compound is aromatic (aryl). Functional groups in the multi-functional reactive compound may include, for example, hydroxy groups, carboxy groups, epoxy groups, acrylate groups, amide groups, vinyl ether, methacrylate, thiol-ene, and the like. In an example, a multi-functional reactive compound (e.g., an aromatic multi-functional reactive compound) includes a carboxy group, a methoxy group, a hydroxy group, and an acrylate group. In some cases, a functional group in a multi-functional reactive compound may serve as an initiator. For example, in response to exposure to broadband ultraviolet radiation, an initiator-type functional group may undergo cleavage to generate a radical that facilitates polymerization of the composition. In an example, an initiator-type functional group may undergo alpha cleavage to generate a benzoyl radical that facilitates radical polymerization. Examples of multi-functional reactive compounds are described in U.S. Patent Application Publication No. 2007/0021520, which is incorporated by reference herein.

A multi-functional reactive compound in a polymerizable composition may be selected such that one functional group interacts or forms bonds with one or more components in the solidified layer on which the polymerizable composition is deposited in response to thermal energy or ultraviolet irradiation. A second functional group may interact or form bonds with (e.g., crosslink) the polymerizable composition itself in response to thermal energy or ultraviolet irradiation. After the polymerizable composition is solidified, a third functional group in the multi-functional reactive compound may interact or form bonds a second polymerizable composition deposited on the solidified adhesion layer or organic underlayer in response to thermal energy or ultraviolet irradiation. That is, the third functional group in the multi-functional reactive compound, which may be exposed at the surface of the solidified adhesion layer or organic underlayer, is able to bond with the second polymerizable composition during polymerization of the second polymerizable composition on top of the adhesion layer or organic underlayer. In some cases, the third functional group may remain essentially unreacted in the solidified layer until polymerization of the second polymerizable composition is initiated, for example, with ultraviolet radiation.

An example of a crosslinking agent in a polymerizable composition used to form an organic underlayer or an adhesion layer of an imprint lithography stack is hexamethoxymethylamine (HMMA). Hexamethoxymethylamine may be obtained as CYMEL® 303ULF, a methylated melamine-formaldehyde resin available from Cytec Industries Inc. (West Paterson, N.J.). HMMA may be catalyzed by a strong acid catalyst, such as CYCAT® 4040, a solution of toluene sulfonic acid in isopropanol, available from Cytec Industries Inc. An example of a solvent in a polymerizable composition used to form an organic underlayer or an adhesion layer is 2-(1-methoxy)propyl acetate or propylene glycol monomethyl ether acetate (PGMEA), available as PM Acetate from Eastman Chemical Company (Kingsport, Tenn.). An example of a multi-functional reactive compound in a polymerizable composition used to form an organic underlayer or adhesion layer is ISORADTM 501, available from Schenectady International, Inc. (Schenectady, N.Y.). ISORADTM 501, shown below, is a carboxy-functional, acrylate oligomer based on o-cresol epoxy novolac resin.

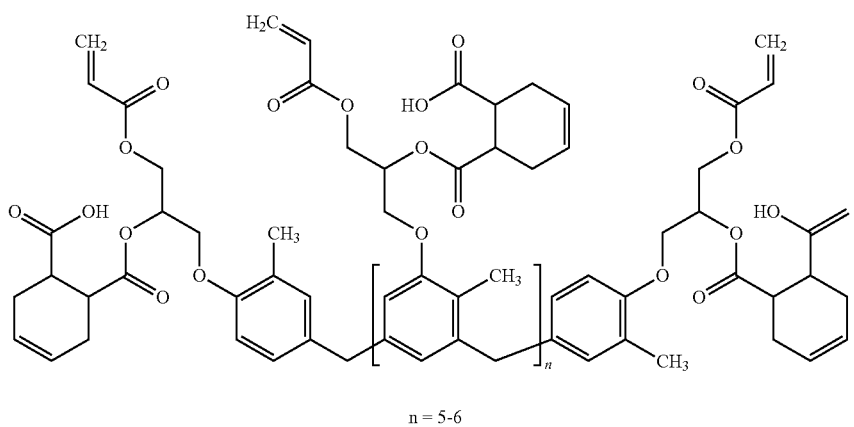

n = 5-6

An example of a polymerizable composition used to form an organic underlayer or an adhesion layer of an imprint lithography stack includes 77 g ISORAD™ 501, 22 g CYMEL® 303ULF, 1 g CYCAT® 4040, and 1900 g PM Acetate.

A solids content of a polymerizable composition used to form an organic underlayer or an adhesion layer of an imprint lithography stack may be adjusted to achieve a suitable layer thickness. For example, a solids content of a polymerizable composition used to form an organic underlayer or an adhesion layer of an imprint lithography stack may be at up to about 25 wt %, or between about 5 wt % and about 20 wt %.

Adhesion layers are described in U.S. Patent Publication Nos. 2007/0212494 and 2007/0017637, both of which are hereby incorporated by reference.

A composition used to form organic imprint resist layer 306 may include one or more monomers, a crosslinking agent, an initiator, and a surfactant. Monomers or other components in the composition may include functionalities such as, for example, vinyl ether, epoxy, methacrylate, thiolene, acrylate, and the like. The initiator may be a photoinitiator responsive to, for example, ultraviolet radiation. The surfactant, added to improve release properties of the resist, may be ionic (e.g., anionic) or non-ionic. The surfactant is non-silicon-containing. The surfactant may be fluorine-containing or non-fluorine containing. Examples of compositions used to form organic imprint resist layers are described in U.S. Pat. No. 7,259,102 to Wang et al. and U.S. Pat. No. 7,307,118 to Xu et al., both of which are incorporated by reference herein.

An example of a monomer for use in an organic imprint resist composition is isobornyl acrylate (IBOA), available as SR506 from Sartomer Company, Inc. (Exton, Pa.). IBOA may be present in a range between about 20 wt % and about 80 wt %. An example of another monomer for use in an organic imprint resist composition is n-hexyl acrylate (n-HA), available from Aldrich Chemical Company (Milwaukee, Wis.). n-HA may be present in a range between about 0 wt % and about 50 wt %. n-HA may be added to reduce a viscosity of the organic imprint resist composition, for example, to less than about 20 cP, less than about 10 cP, or between about 2 cP and about 10 cP. Addition of n-HA may also increase a flexibility of the resulting patterned layer.

An example of a crosslinking agent for use in an imprint resist composition is ethylene glycol diacrylate (EGDA). EGDA may be present in the composition in a range between about 10 wt % and about 25 wt %. EGDA contributes to the modulus and stiffness buildup, and facilitates cross-linking of n-HA and IBOA during polymerization of the imprint resist.

An example of an initiator for use in an imprint resist composition is 2-hydroxy-2-methyl-1-phenyl-propan-1-one, available as DAROCUR® 1173 from Ciba Specialty Chemicals (Tarrytown, N.Y.). DAROCUR® 1173 may be present in the composition in a range between about 1 wt % and about 5 wt %. DAROCUR® 1173 is responsive to broadband ultraviolet energy generated by, for example, a medium pressure mercury lamp. In this manner, the initiator facilitates crosslinking and polymerization of the components in the organic imprint resist composition.

An example of a fluorine-containing, non-ionic surfactant for use in an organic imprint composition is MASURF® FS-2000, available from Mason Chemical Company (Arlington Heights, Ill.). MASURF® FS-2000 may be present in the composition in a range between about 0.1 wt % and about 5 wt % approximately 2% of the bulk material by weight, and may be present in a range of 0.1% to 5%, inclusive.

An example of a polymerizable composition used to form an organic underlayer or an adhesion layer of an imprint lithography stack includes 47 wt % IBOA, 25 wt % n-HA, 25 wt % EGDA, and 3 wt % DAROCUR® 1173, with an additional 2 wt % MASURF® FS-2000.

A silicon-containing composition for use as a hard mask layer may be formulated to achieve enhanced adhesion to an organic underlayer, an adhesion layer, and an organic imprint resist. A hard mask layer with inorganic nature promotes good performance and desirable etch selectivity with respect to the organic imprint resist. A hard mask layer with a high silicon content, for example, about 10 wt % or more, promotes good performance and desirable etch selectivity with respect to the organic underlayer or organic imprint resist. Thus, a desirable hard mask layer may be characterized by a certain degree of inorganic nature as well as a high silicon content. Hard mask layers that are substantially inorganic in nature, however, may have an insufficient number of polar groups to adhere well to organic materials.

A polymerizable composition used to form hard mask layer 308 may be silicon-containing. A silicon-containing polymerizable composition used to form hard mask layer 308 includes a silicon-containing component, a crosslinking agent, a catalyst, and a solvent. For hard mask layers 308 that are substantially inorganic in nature, adhesion to an organic layer may be weak due at least in part to a lack of sufficient polar group interactions between the organic layer and the hard mask layer. Thus, interface 402 between organic underlayer 302 and hard mask layer 308, and interface 404 between hard mask layer 308 and adhesion layer 304, may have weak interfacial adhesion and may be subject to delamination due to tensile forces present during the template separation step. Achieving good adhesion at interface 402 may be difficult, for example, when an organic underlayer such as i-line, KrF, and ArF photoresists do not adhere to the hard mask layer due to lack of polar group interactions. When the hard mask layer is hydrophobic, moisture pick-up is reduced, and a contact angle of water on the hydrophobic hard mask surface may be in a range between about 80° and about 100°. Thus, wetting, and therefore coating, of the hard mask surface, may be limited. To coat and adhere adhesion layer 304 over an unreactive hard mask layer, the hard mask layer may be pre-treated to generate more reactive sites. Treatment methods include pre-treating with oxygen plasma, UV/ozone, and the like.

Silsesquioxanes, or T-resins, are a class of compounds with the empirical formula $RSiO1.5$, where each R is independently hydrogen, hydroxy, alkyl, alkylene, aryl, or arylene. they may be considered to be organic and inorganic in nature. For comparison, $SiO2$ is considered to be fully inorganic in nature, and $R2SiO$ (for example, polydimethylsiloxane, $(CH3)2SiO$) is considered to be more organic in nature than $SiO2$. Methyl silsesquioxane (MSQ) and hydrogen silsesquioxane (HSQ) may be represented as $(RSiO1.5)m(HOSiO1.5)n$, where R is CH3 for MSQ, R is H for HSQ, and m and n are integers. MSQ and HSQ may be considered more inorganic in nature than $(CH3)2SiO$. MSQ and HSQ, however, lack the ability to bond well to organic layers, such as an organic underlayer or an organic imprint resist layer.

A hard mask material may be selected to provide a high silicon content and an advantageous mix of organic and inorganic nature. For example, an effective silicon-containing compound for a hard mask layer such as $(R'(4-2z)SiOz)x(HOSiO1.5)y$, where R' is a hydrocarbon group or two or more different hydrocarbon groups other than methyl (such as, for example, a phenyl group or a substituted phenyl group), $1<z<2$, and x and y are integers, may be more compatible with organic systems (e.g., may promote better adhesion to an organic layer) than other hard mask materials, such as HSQ and MSQ. A hard mask layer including $(R'(4-2z)SiOz)x(HOSiO1.5)y$ may be less hydrophobic than other hard mask layers, with a contact angle of about 60°. Thus, the surface of a hard mask layer formed from $(R'(4-2z)SiOz)x(HOSiO1.5)y$ may be more easily wet by a composition used to form a layer (e.g., an adhesion layer) on top of the hard mask layer. An example of $(R'(4-2z)SiOz)x(HOSiO1.5)y$ is DOW CORNING® 217, a silicon-containing resin binder available from Dow Corning (Midland, Mich.). In DOW CORNING® 217, some or all of the R' are phenyl.

An example of a silicon-containing polymerizable composition that demonstrates enhanced adhesion to organic layers (e.g., organic underlayers and organic imprint resists) includes DOW CORNING® 217, CYMEL® 303ULF, CYCAT® 4040, and PM Acetate. One formulation of this silicon-containing composition includes 80 g DOW CORNING® 217, 18 g CYMEL® 303ULF, 2 g CYCAT® 4040, and 4900 g. PM Acetate. The solids content of this composition is about 2 wt %. After evaporation of the PM Acetate, a silicon content of the composition (e.g., the silicon content of the solidified hard mask layer) is about 15 wt %. The amount of PM Acetate in this composition may be adjusted to achieve a suitable viscosity of the composition or a desired thickness of the hard mask layer.

An interface between a hard mask layer and another layer in an imprint lithography stack (e.g., an organic underlayer, an adhesion layer, an organic imprint resist layer) may exhibit good adhesion due to, for example, strong polar interactions at the interface, formation of covalent bonds between the hard mask layer and an adjacent layer, or any combination thereof. In some cases, polar interactions at the interface include hydrogen bonding, van der Waals forces, or a combination thereof. Formation of covalent bonds may include condensation reactions between reactive groups at the surface of the solidified layer and the polymerizable composition. Formation of covalent bonds may also include crosslinking between reactive surface groups at the surface of the solidified layer and the polymerizable composition. Crosslinking may occur when reactive groups at the surface of the solidified layer and the polymerizable composition have the same crosslinking functional groups, or crosslinking functional groups that are compatible. That is, compositions for layers in an imprint lithography stack (e.g., hard mask layer compositions, adhesion layer compositions, organic underlayer compositions, and organic imprint resist compositions) may be selected such that any two layers that share a common interface (e.g., contacting layers) in the lithography stack include components with the same functionality (e.g., vinyl ether, epoxy, methacrylate, thiol-ene, acrylate, and the like). Common functionalities in adjacent layers increases interfacial adhesion through, for example, covalent bonding and polar interactions.

At interfaces 310 and 402, for example, a component of the hard mask layer 308 may act as a coupling agent and bond with organic imprint resist 306 or organic underlayer 302 at the surface. This bonding may be attributed to similar crosslinking chemistry in the hard mask composition and the organic underlayer. When two adjacent layers have similar functional groups that undergo crosslinking, components in the two layers may crosslink together (e.g., across the interface) when the hard mask layer is polymerized, thereby strengthening the interface between the two layers. Crosslinking may include a condensation reaction or a radical reaction. In some cases, there may be unconsumed reactive functional groups at the surface of the solidified layer (e.g., the organic imprint resist or the organic underlayer) on which the hard mask composition is deposited. These functional groups may react with one or more components of the hard mask composition to form covalent bonds bridging the two layers at the interface, such that interfaces 310 and 402 demonstrate good adhesion. For example, a crosslinking agent in a polymerizable composition with alkoxy (e.g., methoxy) functional groups may undergo a condensation reaction with hydroxy groups or acrylate groups at a surface of a solidified layer to form a covalent bond between the solidified layer and the polymerizable composition during polymerization of the polymerizable composition.

When the organic underlayer is further divided into sub-layers 302' and 302", as shown in FIG. 3B, the polar groups in sub-layer 302" may interact with polar groups in the photoresist or lift-off materials of sub-layer 302' to achieve good interfacial adhesion between the two sub-layers. In some cases, the interaction between a polar group in a first layer and a polar group in a second layer is a hydrogen bonding interaction or a van der Waals interaction.

At interface 404, components in the adhesion layer composition may serve as a coupling agent which can interact with solidified hard mask layer at the surface. This interaction may include forming covalent bonds between unconsumed reactive groups (e.g., hydroxy groups, acrylate groups) in the solidified hard mask layer and the polymerizable composition used to form the adhesion layer during polymerization of the adhesion layer. These covalent bonds, and others resulting from, for example, condensation reactions, bridge the two layers at interface 404, increasing the adhesion between the two layers. Adhesion between the two layers may also be increased by polar interactions such as hydrogen bonding and van der Waals forces.

In an example, a hard mask composition with a crosslinking agent capable of bonding with acrylate functional groups in an organic layer (e.g., an organic imprint resist layer, organic underlayer, or adhesion layer) may form covalent bonds during polymerization of the hard mask composition on one of the organic layers (or during polymerization of one of the organic layers on the hard mask layer) by crosslinking (e.g., condensation) of the functional groups at the interface of the two layers.

EXAMPLE

Adhesion tests as described in U.S. Patent Application Publication No. 2007/0212494, which is incorporated herein by reference, were performed with the modification that a 5 mm glass rod was coated with an adhesion layer including 77 g ISORAD™ 501, 22 g CYMEL® 303ULF, 1 g CYCAT® 4040, and 1900 g PM Acetate (Composition A).

To measure the strength of the adhesion, a four-point bending fixture was adopted for the adhesion test and technique, similar to that described in "Measurement of Adhesive Force Between Mold and Photocurable Resin in Imprint Technology" Japanese Journal of Applied Physics, Vol. 41 (2002) pp. 4194-4197, which is incorporated herein by reference. The maximum force/load was taken as the adhesion value. In the cases in which one of the glass slides broke before delamination occurred or before the glass slides separated, the maximum force/load was taken as the minimum adhesion value. The beam distance of the top and bottom two points is 60 mm. The load was applied at the speed of 0.5 mm per minute.

Composition A was spin-coated on substrates and baked at 150° C. for one minute. Glass rods with a 5 mm diameter were brush-coated with Composition A and baked at 150° C. for about two minutes.

The adhesion test was conducted by placing a drop of organic imprint resist including 47 wt % IBOA, 25 wt % n-HA, 25 wt % EGDA, and 3 wt % DAROCUR® 1173, and an additional 2 wt % MASURF® FS-2000 (Composition B) on the coated substrate, and positioning a coated glass rod on the substrate, such that the glass rod was substantially perpendicular to the lateral plane of the substrate. The imprinting material was cured with ultraviolet radiation. With the glass rod anchored on the substrate, shear testing of the glass rod was performed to assess adhesion of the glass rod to the substrate. That is, the adhesion force was recorded as the force required to shear the glass rod from the substrate.

The shear adhesion force was found to be about 5 lbf for an imprint lithography stack shown in FIG. 4, with MSQ as the hard mask layer. Interface 402 was delaminated first. On the other hand, shear adhesion force was increased to about 30 lbf when the hard mask layer composition included 80 g DOW CORNING® 217, 18 g CYMEL® 303ULF, 2 g CYCAT® 4040, and 4900 g. PM Acetate (Composition C). These results are achieved without pre-treatment of the hard mask layer. The adhesion layer was directly spin coated over the hard mask layer. Thus, adhesion of the hard mask layer was increased by the addition of organic components (e.g., functional groups) to the hard mask layer composition.

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description. Changes may be made in the elements described herein without departing from the spirit and scope as described in the following claims.

What is claimed is:

1. A nano-imprint lithography stack comprising:
a nano-imprint lithography substrate;
a first non-silicon-containing layer solidified from a first polymerizable, non-silicon-containing composition, wherein the first non-silicon-containing layer is adhered directly or through one or more intervening layers to the nano-imprint lithography substrate;
a silicon-containing layer solidified from a polymerizable silicon-containing composition adhered to a surface of the first non-silicon-containing layer, the silicon-containing layer comprising:
a silsesquioxane with a general formula

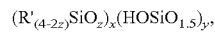

wherein:
R' is a hydrocarbon group or two or more different hydrocarbon groups other than methyl,
$1 < z < 2$, and
x and y are integers; and
a second non-silicon-containing layer solidified from a second polymerizable, non-silicon-containing composition adhered to a surface of the silicon-containing layer such that the silicon-containing layer is sandwiched between the first and second non-silicon-containing layers.

2. The imprint lithography stack of claim 1, wherein a silicon content of the silicon-containing layer is at least about 10 wt %.

3. The imprint lithography stack of claim 1, wherein the silicon-containing layer is adhered to the first non-silicon-containing layer through covalent bonds between carbon-containing components in the first non-silicon-containing layer and carbon-containing components in the silicon-containing composition.

4. The imprint lithography stack of claim 1, wherein the silicon-containing layer is adhered to the first non-silicon-containing layer through polar interactions between carbon-containing components in the first non-silicon-containing layer and carbon-containing components in the silicon-containing composition.

5. The imprint lithography stack of claim 1, wherein the polar interactions comprise hydrogen-bonding interactions.

6. The imprint lithography stack of claim 1, wherein the silicon-containing layer is less than about 100 nm thick.

7. The imprint lithography stack of claim 1, wherein R' comprises a phenyl group.

8. A nano-imprint lithography stack comprising:
a nano-imprint lithography substrate;
a first non-silicon-containing layer solidified from a first polymerizable, non-silicon-containing composition, wherein the first non-silicon-containing layer is adhered directly or through one or more intervening layers to the nano-imprint lithography substrate;
a silicon-containing layer solidified from a polymerizable silicon-containing composition adhered to a surface of the first non-silicon-containing layer, the silicon-containing layer comprising:

a silsesquioxane with a general formula $$(R'_{(4-2z)}SiO_z)_x(HOSiO_{1.5})_y,$$

wherein:
R' is a hydrocarbon group or two or more different hydrocarbon groups other than methyl,
$1<z<2$, and
x and y are integers,
wherein the silicon-containing layer is less than about 100 nm thick.

9. The imprint lithography stack of claim 8, further comprising a second non-silicon-containing layer solidified from a second polymerizable, non-silicon-containing composition adhered to a surface of the silicon-containing layer such that the silicon-containing layer is sandwiched between the first and second non-silicon-containing layers.

10. The imprint lithography stack of claim 8, wherein a silicon content of the silicon-containing layer is at least about 10 wt %.

11. The imprint lithography stack of claim 8, wherein the silicon-containing layer is adhered to the first non-silicon-containing layer through covalent bonds between carbon-containing components in the first non-silicon-containing layer and carbon-containing components in the silicon-containing composition.

12. The imprint lithography stack of claim 8, wherein the silicon-containing layer is adhered to the first non-silicon-containing layer through polar interactions between carbon-containing components in the first non-silicon-containing layer and carbon-containing components in the silicon-containing composition.

13. The imprint lithography stack of claim 8, wherein the polar interactions comprise hydrogen-bonding interactions.

14. The imprint lithography stack of claim 8, wherein R' comprises a phenyl group.

* * * * *